United States Patent [19]

Van Roermund et al.

[11] Patent Number: 4,691,171

[45] Date of Patent: Sep. 1, 1987

[54] INTEGRATED RC FILTER WITH RESISTOR TRIMMING

[75] Inventors: Arthur H. M. Van Roermund; Petrus M. C. Coppelmans, both of Eindhoven, Netherlands

[73] Assignee: U.S. Philips Corporation, New York, N.Y.

[21] Appl. No.: 728,126

[22] Filed: Apr. 29, 1985

[30] Foreign Application Priority Data

May 1, 1984 [NL] Netherlands .................. 8401370

[51] Int. Cl.[4] .................. H03K 5/00; H03B 1/00; H04B 1/10
[52] U.S. Cl. .................. 328/167; 328/127; 307/520; 307/521
[58] Field of Search ............ 328/127, 133, 167, 155; 307/520, 521, 262; 330/107, 109, 110

[56] References Cited

U.S. PATENT DOCUMENTS

| | | | |
|---|---|---|---|
| 3,070,762 | 12/1962 | Evans | 307/520 |
| 3,715,680 | 2/1973 | Flerscher | 330/109 |
| 3,760,289 | 9/1973 | Hurtig, III | 330/109 |
| 3,787,778 | 1/1974 | Carré et al. | 330/109 |
| 3,824,501 | 7/1974 | Harris | 328/167 |
| 4,114,117 | 9/1978 | Ford | 328/167 |
| 4,132,957 | 1/1979 | Hekimian et al. | 330/110 |
| 4,392,068 | 7/1983 | Welles, III | 307/520 |

Primary Examiner—Stanley D. Miller
Assistant Examiner—Timothy P. Callahan
Attorney, Agent, or Firm—Robert T. Mayer; Bernard Franzblau

[57] ABSTRACT

A first resistor ($R_1$) and a first capacitor ($C_1$) constitute a filter arrangement having a time constant which is not very accurate due to the inaccuracy of the resistor and the capacitor values in integrated circuits. The time constant is adjusted using a circuit comprising a reference resistor ($R_2$) and a switched capacitor ($C_3$). The value of the reference resistor ($R_2$) and the equivalent resistance of the switched capacitor ($C_3$) are compared by means of an integrator ($C_2$, 2) from whose output (9) a control voltage is taken via a hold circuit ($C_4$, $C_5$). The control voltage is equal to the voltage at that point on the reference resistor where the resistance value is equal to that of the switched capacitor ($C_3$). By means of comparators (21 to 30) and switches ($S_{11}$ to $S_{20}$) a percentage of the total resitance of the first resistor ($R_1$) is short-circuited. This percentage is equal to the difference between the resistance of the reference resistor ($R_2$) and the equivalent resistance of the switched capacitor ($C_3$), expressed as a percentage of this equivalent resistance.

14 Claims, 2 Drawing Figures

INTEGRATED RC FILTER WITH RESISTOR TRIMMING

BACKGROUND OF THE INVENTION

This invention relates to a filter arrangement comprising at least a first resistor and a first capacitor, which provide a time constant determined by the product of the resistance of the resistor and the capacitance of the capacitor, and a trimming circuit comprising a switched second capacitor for adjusting the time constant of the filter arrangement.

By means of such an arrangement any known active or passive filter can be formed. In particular, such an arrangement may constitute an input or an output filter in a discrete-time switched-capacitor filter.

In integrated circuits resistors and capacitors can be fabricated only with a limited accuracy. As a result the time constants in the filter arrangements are very inaccurate. The article "Switched Resistor Filters—A continuous Time Approach to Monolithic MOS-Filter Design", IEEE Transactions on Circuits and Systems, Vol. Cas-29, No. 5, May 1982, pages 306–315, describes a filter arrangement which enables more acurate time constants to be obtained. In this arrangement each resistor is constituted by a field-effect transistor (FET) whose resistance is determined by a voltage established between the gate and the source by means of a capacitor. For each resistor there are provided two FETs which are alternately switched into the actual filter and into a trimming circuit. In this trimming circuit the resistance of the FET is made equal to the equivalent resistance of a switched capacitor. This results in a time constant which only depends on the ratio between the capacitance of the capacitor in the actual filter and the capacitance of the switched capacitor and the clock frequency with which the capacitor is switched. During integration a very accurate capacitance ratio between the capacitors can be obtained. The clock frequency, which is determined by an external circuit, can also be defined accurately.

However, a drawback of this known circuit arrangement is that the non-linear relationship between the resistance of the FETs and the control voltages gives rise to inaccuracies in the time constants. Moreover the resistances of the FETs for equal gate voltages are found to differ substantially due to differences in the voltages on the drain electrodes and on the backgates. Further, the use of two FETs for each resistor is likely to give rise to crosstalk between the clock signals employed for switching.

SUMMARY OF THE INVENTION

Therefore, it is an object of the invention to provide a filter arrangement comprising a trimming circuit by means of which the time constants can be adjusted more accurately. According to the invention a filter arrangement of the type specified in the opening paragraph is characterized in that the trimming circuit further comprises:

a reference resistor across which a first reference voltage is established. A second reference voltage which is proportional to the first reference voltage is established across the second capacitor.

First means are provided for generating a control voltage which is a measure of the difference between the resistance of the reference resistor and the equivalent resistance of the second capacitor, which equivalent resistance is substantially equal to the ratio between the second reference voltage and the charge transfer per unit of time averaged over a specific time interval owing to the complete discharge of said second capacitor in said time interval, and second means for short-circuiting a part of the first resistor by means of said control voltage, which part expressed as a percentage of the total resistance of said first resistor, is substantially equal to the difference between the resistance of the reference resistor and the equivalent resistance of the second capacitor, expressed as a percentage of the resistance of the reference resistor.

Like the known arrangement, an arrangement in accordance with the invention utilizes the fact that the time constant constituted by the equivalent resistance of the second switched capacitor and the first capacitor depends only on the ratio between the capacitances of these capacitors and on the clock period with which the second capacitor is switched. The invention is based on the recognition of the fact that this dependence can also be obtained for the actual time constant of the filter by comparing the value of a reference resistor with the equivalent resistance of the switched second capacitor in a trimming circuit in order to determine the position on the reference resistor where its resistance value is equal to that of the switched second capacitor. The desired time constant of the filter is then obtained by short-circuiting the first resistor from the same relative position as the position found on the reference resistor.

In a filter arrangement in accordance with the invention real resistors are trimmed, thereby precluding the occurence of nonlinearities. Since the filter comprises only one resistor for each time constant, there is no cross-talk between the switching clocks. Another major advantage of an arrangement in accordance with the invention is that all of the time constants of a filter arrangement can be adjusted by means of one trimming circuit.

In an embodiment of the invention the first means for generating the control voltage may comprise an integrator which comprises an amplifier having an inverting input, a non-inverting input at a fixed potential, and an output which is fed back to the inverting input by means of a third capacitor. The inverting input is further connected to a first terminal of a reference resistor having a second terminal at a first reference potential. The integrator integrates the current through the reference resistor during a first time interval. The second capacitor supplies an amount of charge to the inverting input corresponding to a voltage across the switched capacitor equal to the second reference voltage at a first instant in the first time interval. The control voltage is taken from the output of the amplifier at a second instant in the first time interval. In the case of a positive first reference voltage the voltage on the integrator decreases linearly when the integration interval begins. At the instant that the charge on the second capacitor is applied to the input of the amplifier a voltage transient occurs at the output, after which the voltage again decreases linearly. If, at the second instant, the total voltage variation at the output of the integrator has become equal to zero, the equivalent resistance of the second capacitor will be equal to the resistance of the reference resistor. If, at the second instant, the voltage at the output of the integrator is positive, the equivalent resistance of the second capacitor will be smaller than the value of the reference resistor. The voltage at the output of the integrator is then equal to the voltage across the difference between the resistance of the reference resistor and the equivalent resistance of the second capacitor.

The first means may be characterized further in that it comprises:

a first switch arranged between the output and the inverting input of the amplifier.

a second switch for connecting a first terminal of the second capacitor to a third terminal which is at a second reference potential and to a first point which is at the same potential as the noninverting input of the amplifier, a third switch for connecting the second terminal of the second capacitor to a second point which is at the same potential as the noninverting input of the amplifier and to the inverting input of the amplifier, and first and second clock means for controlling the first switch, the second switch and the third switch, the first clock means switching the second capacitor between the third terminal and the second point and shortcircuiting the third capacitor by means of the first switch during a second time interval, and the second clock means switching the second capacitor between the first point and the inverting input of the amplifier during a third time interval starting at the first instant and continuing until at least the second instant.

The first means may further comprise a hold circuit for holding the output voltage of the integrator from the second instant until the corresponding instant in the next integration interval. Suitably, the hold circuit may constitute a filter circuit for filtering undesired signal components out of the output voltage of the integrator. Such a hold circuit may comprise a fourth capacitor which can be connected to the output of the amplifier and in parallel with a fifth capacitor by means of a fourth switch.

The second means for short-circuiting parts of the first resistor may be characterized in that it comprises a plurality of comparators having first inputs and second inputs, of which the first inputs carry the control voltage and the second inputs are coupled to equidistantly spaced tappings on the reference resistor. These comparators further comprise first outputs and second outputs for controlling switches which can short-circuit parts of the first resistor, which parts, expressed as percentages of the total resistance of said first resistor, are substantially equal to the parts situated between the tappings on the reference resistor, expressed as percentages of the total resistance of said reference resistor. Preferably, the comparators exhibit hysteresis in order to ensure that they are not responsive to, for example, noise. If the filter arrangement comprises further resistors which define further "time constants" in conjunction with associated capacitors, these further resistors may be provided with switches which can short-circuit parts of the resistors, which parts, expressed as percentages of the total resistance of said further resistors, are substantially equal to the parts situated between the tappings on the reference resistor, expressed as percentages of the total resistance of said reference resistor. The first outputs and the second outputs of the comparators control the switches associated with these resistors.

BRIEF DESCRIPTION OF THE DRAWINGS

The invention will now be described in more detail, by way of example, with reference to the accompanying drawings, in which.

DESCRIPTION OF THE PREFERRED EMBODIMENTS

Figure 1:
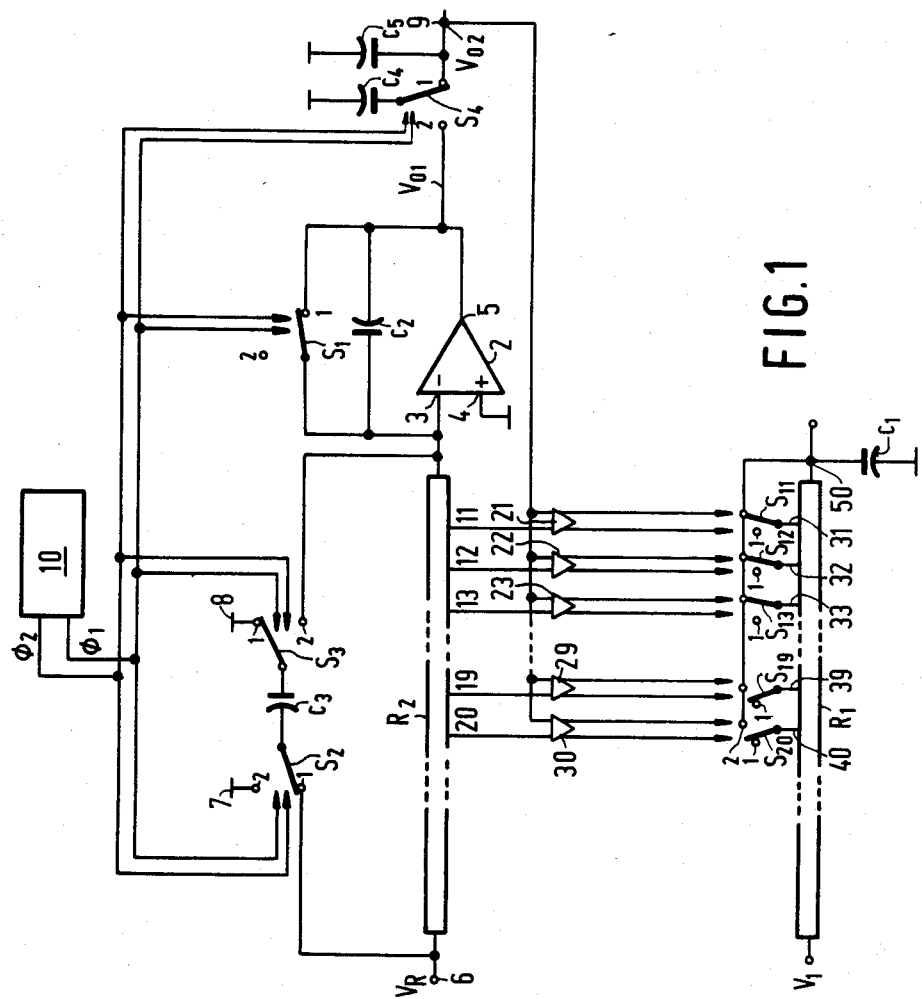
FIG. 1 shows a first embodiment of the invention.

FIG. 1 shows a first filter arrangement in accordance with the invention. The actual filter is constituted by a passive first-order low-pass filter comprising a resistor $R_1 = R$ and a capacitor $C_1 = C$ providing a time constant RC, in which the input signal $V_1$ to be filtered is applied to the resistor $R_1$ and the filtered signal is taken from the capacitor $C_1$. However, the resistor $R_1$ and the capacitor $C_1$ cannot be integrated very accurately so that the RC time constant is very inaccurate. In order to obtain an accurate time constant the filter arrangement is provided with a trimming circuit. This circuit comprises an integrator constituted by an operational amplifier 2 having an inverting input 3, a non-inverting input 4, and an output 5. The non-inverting input 4 is at a reference voltage, in the present case 0 V. Capacitor $C_2$, which can be short-circuited by means of a switch $S_1$, provides feedback from the output 5 to the inverting input 3. A reference resistor $R_2 = R$ is arranged between the inverting input 3 and the input 6 of the integrator. A reference voltage $V_R$ is applied to the input 6. The integrator further comprises a capacitor $C_3$ which can be switched between the input 6 and the ground point 8 and between the inverting input 3 and ground point 7 by means of switches $S_2$ and $S_3$. The output 5 of the integrator is also connected to a hold and filter circuit comprising a capacitor $C_4$ and a hold capacitor $C_5$. By means of a switch $S_4$ the capacitor $C_4$ can be connected to the output 5 of the integrator and to the terminal 9 of the capacitor $C_5$. It is to be noted that the switches $S_1$ to $S_4$ may be of any known type and may comprise, for example, p-channel field-effect transistors. The switches $S_1$ to $S_4$ are controlled by clock means 10, shown schematically, which supply clock pulses $\phi_1$ and $\phi_2$.

The end of the reference resistor $R_2$ which is connected to the amplifier 2 comprises a plurality of regularly spaced tappings 11 to 20. The tappings are each connected to one of the inputs of one of the comparators 21 to 30. The other inputs of the comparators are connected to the output 9 of the hold circuit. The resistor $R_1$ of the filter also comprises a plurality of tappings 31 to 40 which are spaced in the same way as the tappings on the reference resistor $R_2$ because, in the present example, the reference resistor is identical to the resistor $R_1$. The output of the comparators 21 to 30 control switches $S_{11}$ to $S_{20}$, which in turn connect the tappings 31 to 40 to the junction point 50 of the resistor $R_1$ and the capacitor $C_1$ and which can thus shortcircuit parts of the resistor $R_1$. The switches $S_{11}$ to $S_{20}$ may comprise, for example, an N-channel and a P-channel field effect transistor whose source and drain electrodes have been interconnected.

Figure 2:
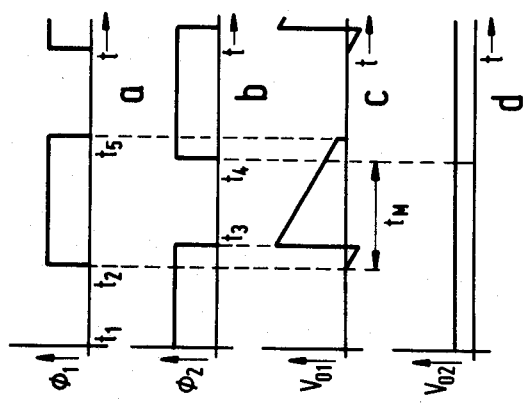
FIG. 2 shows the clock signals for controlling the switches and some voltage waveforms appearing in the arrangements shown in FIG. 1.

The operation of the arrangement will be described with reference to FIG. 2, in which FIGS. 2a and 2b show the clock signals $\phi_1$ and $\phi_2$ for controlling the switches $S_1$ to $S_4$ and FIGS. 2c and 2d show the voltage $V_{o1}$ on the output 5 of the integrator and the voltage $V_{o2}$ on the output 9 of the hold circuit, respectively.

If the clock signal $\phi_1$ is low the switches $S_1$ to $S_4$ are in position 1 and if the clock signal $\phi_1$ is high the switches $S_1$ to $S_4$ are open, unless the clock signal $\phi_2$ is low, in which case the switches $S_1$ to $S_4$ are in position 2. If the clock signal $\phi_2$ is high the switches $S_1$ to $S_4$ are open, unless the clock signal $\phi_1$ is low.

In the interval $t_1-t_2$ of the clock signal $\phi_1$ the capacitor $C_2$ is short-circuited by the switch $S_1$, so that this capacitor is fully discharged. The current through the reference resistor $R_2$ is then drained to the output of the operational amplifier 2. At the same time capacitor $C_3$ is charged to the reference voltage $V_R$. At the instant $t_2$ at which the clock signal $\phi_1$ goes high, the switch $S_1$ opens so that the input voltage $V_R$ is integrated by the integrator. The voltage on the output 5 of the integrator then decreases in conformity with the equation:

$$V_{o1} = -V_R(t/R_2C_2) \quad (1)$$

At the instant $t=t_3$ the clock signal $\phi_2$ goes low. The capacitor $C_3$ is then connected to the inverting input 3 of the amplifier 2 so that the voltage on this input becomes equal to $-V_R$. Since the noninverting input 4 is at a voltage of 0 V, the inverting input 3 is a virtual earthing ground point. The operational amplifier 2 immediately causes the inverting input 3 to return to zero volts via capacitor $C_2$. As a result of this, a voltage transient will appear on the output 5 of the integrator at the instant $t=t_3$, which transient is given by:

$$\Delta V_{o1} = V_R \cdot (C_3/C_2) \quad (2)$$

After this voltage transient the integration of the reference voltage $V_R$ proceeds in the same way so that the voltage $V_{o1}$ on the output then varies as shown in FIG. 2C.

At the instant $t=t_4$ the clock signal $\phi_2$ goes high again so that the switch $S_4$ is opened. The capacitor $C_4$ then carries the output voltage $V_{o1}$ at the instant $t=t_4$, i.e. the voltage at an instant $t_m=t_4-t_2$ after the beginning of the integration. At the instant $t=t_5$ the clock signal $\phi_1$ goes low again so that the switch $S_4$ is set to position 1. The voltage on the hold capacitor $C_5$ then becomes equal to the voltage on capacitor $C_4$. In has been assumed that a number of clock cycles has elapsed prior to the instant $t=t_1$, because in reality the voltage on the capacitor $C_5$ will not be equal to the voltage on the capacitor $C_4$ until a number of clock cycles has elapsed due to the voltage division effected by these capacitors. As a result of this, the hold circuit also constitutes a filter circuit. Spurious voltages in the output voltage of the integrator as a result of, for example, switching transients or noise will influence the voltage on the hold capacitor only to a small extent owing to the voltage division. In this respect it is an advantage that the hold capacitor $C_5$ has a substantially higher capacitance than the capacitor $C_4$.

For the voltage $V_{o2}$ on the output 9 of the hold circuit it follows from equation (1) and (2) that:

$$V_{o2} = V_{o1}(t=t_4) = V_R\left(\frac{C_3}{C_2} - \frac{t_m}{R_2C_2}\right) \quad (3)$$

If capacitors $C_2$ and $C_3$ are identical, i.e. $C_2=C_3=C_R$, it follows that $$V_{o2} = V_R\left(1 - \frac{t_m}{R_2C_R}\right) \quad (4)$$

This voltage is equal to the voltage at that point on the reference resistor $R_2$ where the resistance between this point and the input 6 is equal to the equivalent resistance of the capacitor $C_3$, which resistance is equal to $t_m/C_R$ over the interval $t_m$. Indeed the voltage between this point and input 6 is equal to:

$$V_R \cdot (t_m/R_2C_R) \quad (5)$$

This voltage corresponds to a resistance value equal to:

$$R^x = R_2 \cdot (t_m/R_2C_R) = t_m/C_R \quad (6)$$

The control voltage as given by equation (4) appears on a input of each comparator 21 to 30. The inputs of the comparators 21 to 30 which are connected to the tappings 11 to 20 on the reference resistor $R_2$ carry a voltage which increases stepwise from zero volts. The outputs of the comparators 21 to 30 for which the control voltage $V_{o2}$ on one input is higher than the tapped voltage on the other input set the corresponding switches $S_{11}$ to $S_{20}$ connected to the tappings 31 to 40 from position 1 to position 2. As a result of this, a part of resistor $R_1$ is shortcircuited, which part is substantially equal to the part of the reference resistor $R_2$ across which the voltage $V_{o2}$ appears.

The effective time constant of the filter arrangement then becomes equal to:

$$\tau_{eff} = R^x \cdot C = (C/C_R) \cdot t_m \quad (7)$$

Thus, the time constant is determined by the ratio between two capacitances, which can be established accurately by means of integrated-circuit technology, and by a time interval, which can be defined very accurately by the clock means.

The accuracy with which the time constant is realised also depends on the number of comparators used. Only in the case of an unlimited number of comparators will the part of the resistor $R_1$ that is short-circuited exactly correspond to the control voltage $V_{o2}$. In the case of a limited number of comparators the accuracy depends on the fraction of the resistor which can be short-circuited and the number of comparators used for this purpose. The magnitude of the fraction is determined by the inaccuracy in the value of the uncorrected time constant $R_1C_1$ of the filter. If this is for example 25%, it is adequate when ¼ of the resistor can be short-circuited. The reference resistor and the resistor to be trimmed can only be made equal to each other with a limited accuracy by means of integrated circuit technology. The maximum number of comparators for short circuiting a specific fraction then depends on the inaccuracy in the equality of the resistors.

The comparators may be of any customary type. In order to ensure that if the control voltage on one input is substantially equal to the tapped voltage on the other input, the outputs of the comparators cannot alternately short-circuit and not short-circuit a portion of the resistor, for example in response to noise, the comparators preferably exhibit hysteresis in their control characteristics. As a result of this, the part which is short-circuited, for example if the control voltage exceeds the tapped voltage, is not switched in again until the control voltage drops a specific amount below the tapped voltage.

In the present embodiment the value of the resistor $R_1$ to be trimmed is equal to the value of the reference resistor $R_2$, so that the desired time constant is obtained by short-circuiting a part of the resistor $R_1$ equal to that part of the reference resistor $R_2$ across which the control voltage appears. However, the resistor to be trimmed may alternatively have a resistance value which differs from that of the reference resistor. The tapping on the resistor $R_1$ to be trimmed should then be arranged in such a way that the part which can be short-circuited, expressed as a percentage, is equal to the part with the tappings of the reference resistor $R_2$. The effective time constant (see equation 7) is then equal to:

$$\tau'_{eff}=(R_1/R_2)\cdot\tau_{eff}=(R_1C/R_2C_R)\cdot t_m \quad (8)$$

Figure 3:
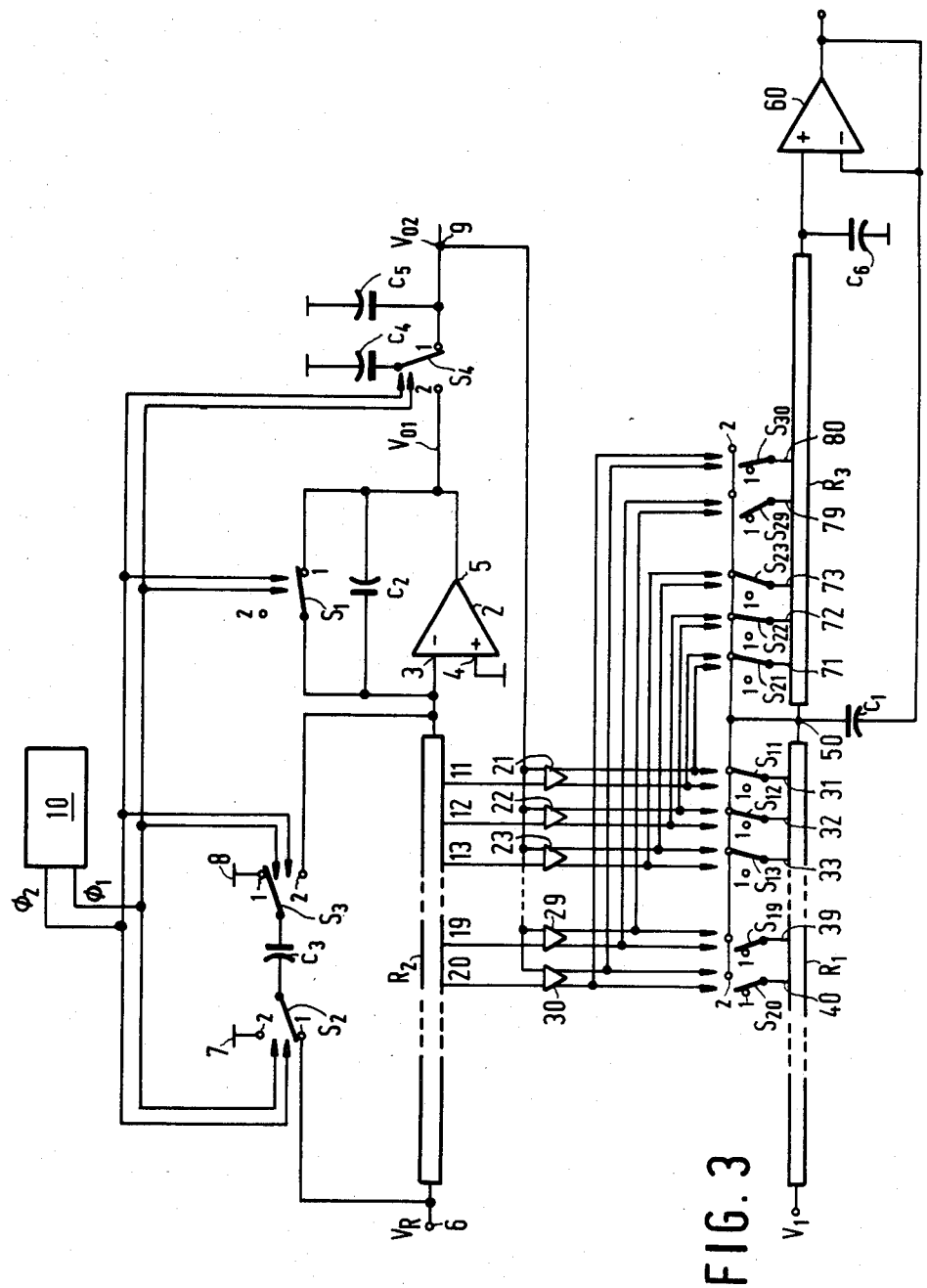
FIG. 3 shows a second embodiment of the invention.

In the present embodiment, prior to the integration period, the capacitor $C_3$ is connected to terminal 6 which is at the reference voltage $V_R$. In an alternative embodiment capacitor $C_3$ may be connected to a separate terminal which is at a reference voltage $V_R'=\alpha'V_R$, where $\alpha$ is a proportionality constant. In order to obtain the same equivalent resistance of capacitor $C_3$ as in the embodiment described, the total amount of charge of capacitor $C_3$ should be the same. Capacitor $C_3$ should then have a capacitance $C_3'=C_3/\alpha$. In the present embodiment the capacitor $C_4$ is disconnected from the output of the integrator at the instant $t=t_4$, at which the capacitor $C_3$ is disconnected from the inverting input 3 of the integrator. It is noted that the capacitor $C_3$ may be disconnected from this input at an instant later than $t=t_4$. An advantage of the filter arrangement in accordance with the invention is that all of the time constants in the filter can be adjusted simultaneously by means of one trimming circuit. An embodiment in which two time constants are adjusted will be described with reference to FIG. 3, which shows a second-order Sallen and Key filter. This filter is employed as an anti-aliasing input filter for a discrete-time switched-capacitor filter. Indentical parts bear the same reference numerals as in FIG. 1. The actual filter comprises a resistor $R_1$ and a resistor $R_3$ which should bear a specific relation to the capacitor $C_1$ and the capacitor $C_6$ for a specific filter action. The resistor $R_3$ and capacitor $C_6$ are connected to the non-inverting input of an operational amplifier 60 with full negative feedback. The inverting input of operational amplifier 60 is connected to that terminal of the capacitor $C_1$ which is remote from the junction point 50. The resistor $R_3$ comprises tappings 71 to 80 which, like the tappings on the resistor $R_1$, are spaced from each other at distances whose ratio to the distances between the tappings 11 to 20 on the reference resistor is equal to the ratio between the resistance values of these resistors. The tappings are connected to switches $S_{21}$ to $S_{30}$ which, like the switches $S_{11}$ to $S_{20}$, are controlled by the outputs of the comparators 21 to 30. Thus, a part of the resistor $R_3$ is short-circuited which is proportional to the part of the resistor $R_1$ which is short-circuited. The two resistors are then trimmed in such a way that in conjunction with the capacitors they give the desired filter characteristic.

The invention is not limited to the embodiments described in the foregoing but may also be used for the adjustment of time constants in any passive or active filter arrangement. Further, a large number of modifications of the embodiments described are possible. For example, instead of the integrator, any other circuit for generating a control voltage which is a measure of the difference between the resistance of the reference resistor and the equivalent resistance of the switched capacitor may be used. For the hold circuit many other circuit arangements are conceivable to those skilled in the art. The hold circuit is not required if clocked comparators are employed in which the voltages on the outputs do not change between two clock periods.

What is claimed is:

1. A filter arrangement comprising, at least a first resistor and a first capacitor, said arrangement having a time constant determined by the product of the resistance of the resistor and the capacitance of the capacitor, and a trimming circuit for adjusting the time constant of the filter arrangement, characterized in that the trimming circuit comprises: means for generating clock signals, a reference resistor, a second capacitor switchable by at least a first switch cyclically controlled by the clock means, a source of reference voltage coupled to the reference resistor and via said first switch to the second capacitor so that a first reference voltage is established across the reference resistor and a second reference voltage, which is proportional to the first reference voltage, is established across the second capacitor, first means coupled to the second capacitor via a second switch cyclically controlled by the clock means for generating a control voltage determined by the difference between the resistance of the reference resistor and the equivalent resistance of the second capacitor, and second means responsive to said control voltage for short-circuiting a part of the firt resistor, said part, expressed as a percentage of the resistance of said first resistor, being substantially equal to the difference between the resistance of the reference resistor and the equivalent resistance of the second capacitor, expressed as a percentage of the resistance of said reference resistor.

2. A filter arrangement as claimed in claim 1, characterized in that the clock means produce clock signals for the first and second switches that establish a first time interval with first and second instants of time defined within said first time interval, wherein the first means comprise an integrator which includes an amplifier having an inverting input, a non-inverting input at a reference potential, and an output which is fed back to the inverting input by means of a third capacitor, said inverting input being connected to a first terminal of said reference resistor, said reference resistor having a second terminal coupled to the reference voltage source, wherein the integrator integrates the current through the reference resistor during the first time interval and the second capacitor is coupled to the inverting input at the first instant in the first time interval, and wherein the control voltage is available at the output of the amplifier at the second instant in the first interval.

3. A filter arrangement as claimed in claim 2 wherein the first means include a third switch coupled between the output and the inverting input of the amplifier, and wherein the first switch selectively connects a first terminal of the second capacitor to said reference voltage source and to said reference potential, and the second switch selectively connects a second terminal of the second capacitor to said reference potential and to the inverting input of the amplifier, and wherein said clock means produce clock signals that establish a second time interval and a third time interval and control the first switch, the second switch and the third switch, the clock means short-circuiting the third capacitor by means of the third switch during the second time interval, the clock mean switching the second capacitor between the reference potential and the inverting input of the amplifier during the third time interval which starts at the first instant and continues until at least the second instant.

4. A filter arrangement as claimed in claim 2 or 3, characterized in that the first means further comprise a hold circuit for holding the output voltage of the integrator for a time starting from the second instant.

5. A filter arrangement as claimed in claim 4, characterized in that the hold circuit includes a filter circuit for filtering undesired signal components out of the output voltage of the integrator.

6. A filter arrangement as caimed in claim 5, characterized in that the hold circuit comprises a fourth capacitor which can be selectively connected to the output of the amplifier or in parallel with a fifth capacitor by means of a fourth switch.

7. A filter arrangement as claimed in claim 6, wherein the fourth switch is controlled by the clock means to selectively connect the fourth capacitor in parallel with the fifth capacitor during the second time interval and the fourth capacitor to the output of the amplifier during the third time interval.

8. A filter arrangement as claimed in claim 1, characterized in that the second means comprise a plurality of comparators having first inputs and second inputs, wherein the first inputs receive the control voltage and the second inputs are coupled to equidistantly spaced tappings on the reference resistor, wherein the comparators further comprise first outputs and second outputs for controlling switches which selectively short-circuit parts of the first resistor, which parts, expressed as percentages of the total resistance of said first resistor, are substantially equal to the parts situated between the tappings on the reference resistor, expressed as percentages of the total resistance of said reference resistor.

9. A filter arrangement as claimed in claim 8, characterized in that the comparators each have a first threshold voltage and a second threshold voltage whereby the comparators exhibit a hysterisis characteristic.

10. A filter arrangement as claimed in claim 8, characterized in that for each resistor in the filter arrangement, which resistor bears a specific relationship to the associated capacitor in order to obtain a desired filter action, associated switches are provided which can short-circuit parts of the resistor, which parts, expressed as percentages of the total resistance of said resistor, are substantially equal to the parts situated between the tappings on the reference resistor, expressed as percentages of the total resistance of said reference resistor, and the first outputs and second outputs of the comparators control the switches associated with said resistors.

11. A filter arrangement comprising: a first resistor and a first capacitor wherein the arrangement has a time constant determined by the product of the resistance of the resistor and the capacitance of the capacitor, and a trimming circuit for more accurately adjusting the time constant of the filter arrangement to a desired time constant by adjusting the resistance of the first resistor, wherein the trimming circuit comprises:

a reference resistor having a first terminal which is at a first reference potential and a second terminal which is at a second reference potential so that the first and the second reference potential determine a first reference voltage developed across the reference resistor, switched capacitor means comprising a second capacitor and first and second switches controlled by clock means so that the second capacitor is charged until a second reference voltage is established across the second capacitor during a first time interval of the clock means and is discharged in a second time interval of the clock means in order to generate an equivalent resistance which is equal to the charge transfer per unit of time averaged over the second time interval, first means for generating a control voltage proportional to the difference between the resistance of the reference resistor and said equivalent resistance of the switched capacitor means, and second means for short-circuiting a part of the first resistor to adjust its resistance as determined by said control voltage and which part, expressed as a percentage of the resistance of said first resistor, is substantially equal to the difference between the resistance of the reference resistor and the equivalent resistance of the switched capacitor means, expressed as a percentage of the resistance of said reference resistor.

12. A filter arrangement as claimed in claim 11, characterized in that the first means comprise an integrator which includes an amplifier having an inverting input, a non-inverting input at the second reference potential and an output fed back to the inverting input by means of a third capacitor, said inverting input being connected to the second terminal of the reference resistor, wherein the integrator integrates a current through the reference resistor during at least the second time interval, the second capacitor being discharged via the integrator in the second time interval, and wherein the control voltage is taken from the output of the amplifier at the end of the second time interval.

13. A filter arrangement as claimed in claim 12 characterized in that:

the first switch of the switched capacitor means selectively connects a first terminal of the second capacitor to a third terminal which is at a third reference potential or to a fourth terminal which is at the second reference potential, the difference between the third and the second reference potential determining the second reference voltage established across the second capacitor, the second switch of the switched capacitor means selectively connects a second terminal of the second capacitor to the fourth terminal or to the inverting input of the amplifier, the first means further comprise a third switch which selectively connects the amplifier output to the inverting input, and the clock means control the first, second and third switches such that the second capacitor is connected between the third and the fourth terminal and the third switch connects the output to the inverting input of the amplifier during the first time interval, and the second capacitor is connected between the fourth terminal and the inverting input of the amplifier during a further time interval starting in the second time interval and continuing until the end of the second time interval.

14. A filter arrangement as claimed in claims 12 or 13 characterized in that the first means further comprise a hold circuit for holding the control voltage of the integrator for a given time starting from the end of the second time-interval.

* * * * *

UNITED STATES PATENT AND TRADEMARK OFFICE
CERTIFICATE OF CORRECTION

PATENT NO. : 4.691.171

DATED : September 1, 1987

INVENTOR(S) : Arthur H.M. Van Roermund, et al

It is certified that error appears in the above-identified patent and that said Letters Patent is hereby corrected as shown below:

IN THE CLAIMS

Claim 1, line 24. change "firt" to --first--

Claim 3, line 17. change "mean" to --means--

Signed and Sealed this

Twenty-fourth Day of January, 1989

Attest:

DONALD J. QUIGG

Attesting Officer     Commissioner of Patents and Trademarks

UNITED STATES PATENT AND TRADEMARK OFFICE
CERTIFICATE OF CORRECTION

PATENT NO. : 4,691,171

DATED : September 1, 1987

INVENTOR(S) : Arthur H.M. Van Roermund et al

It is certified that error appears in the above-identified patent and that said Letters Patent is hereby corrected as shown below:

Claim 2, line 18 after "first" insert --time--.

Signed and Sealed this

Eighteenth Day of April, 1989

Attest:

DONALD J. QUIGG

*Attesting Officer*

Commissioner of Patents and Trademarks